(12) United States Patent
Steiner et al.

(10) Patent No.: US 9,481,134 B2
(45) Date of Patent: Nov. 1, 2016

(54) BUILD PLATFORM LEVELING WITH TACTILE FEEDBACK

(71) Applicant: MakerBot Industries, LLC, Brooklyn, NY (US)

(72) Inventors: Robert J. Steiner, Port Jefferson, NY (US); Ariel Douglas, Brooklyn, NY (US)

(73) Assignee: MakerBot Industries, LLC, Brooklyn, NY (US)

( * ) Notice: Subject to any disclaimer, the term of this patent is extended or adjusted under 35 U.S.C. 154(b) by 804 days.

(21) Appl. No.: 13/669,646

(22) Filed: Nov. 6, 2012

(65) Prior Publication Data

US 2013/0327917 A1    Dec. 12, 2013

Related U.S. Application Data

(60) Provisional application No. 61/657,241, filed on Jun. 8, 2012.

(51) Int. Cl.

| | | |
|---|---|---|
| *B29C 67/00* | (2006.01) | |
| *F16M 13/02* | (2006.01) | |
| *G06F 17/50* | (2006.01) | |
| *G06F 3/12* | (2006.01) | |
| *F16M 11/12* | (2006.01) | |
| *F16M 11/18* | (2006.01) | |
| *G05B 19/4099* | (2006.01) | |
| *B33Y 50/02* | (2015.01) | |

(52) U.S. Cl.
CPC ....... *B29C 67/0088* (2013.01); *B29C 67/0059* (2013.01); *B29C 67/0081* (2013.01); *B29C 67/0085* (2013.01); *F16M 11/12* (2013.01); *F16M 11/18* (2013.01); *F16M 13/022* (2013.01); *G05B 19/4099* (2013.01); *G06F 3/126* (2013.01); *G06F 3/1224* (2013.01); *G06F 17/50* (2013.01); *B33Y 50/02* (2014.12); *G05B 2219/35134* (2013.01); *G05B 2219/49007* (2013.01); *Y02T 10/82* (2013.01)

(58) Field of Classification Search
CPC .......... B29C 67/0081; B29C 67/0085; B29C 67/0051; B29C 67/0055; B29C 67/0059; B29C 67/0077; B29C 67/0088; G05B 19/4099; G05B 2219/35134; G05B 2219/49007; F16M 11/18; F16M 11/12; F16M 13/022; G06F 17/50; G06F 3/1224; G06F 3/126; B33Y 50/02; Y02T 10/82; G06Q 10/06
USPC .............. 425/174.4, 174, 375; 264/113, 112, 264/308; 700/95, 98, 97, 111, 117–120
See application file for complete search history.

(56) References Cited

U.S. PATENT DOCUMENTS

| | | | | |
|---|---|---|---|---|
| 4,255,221 A | * | 3/1981 | Young | 156/382 |
| 5,033,219 A | * | 7/1991 | Johnson et al. | 42/115 |

(Continued)

OTHER PUBLICATIONS

"3D FUNPOD", http://phlatboyz.blogspot.com/2012/02/3d-printed-micro-3d-3d-funpod-3d-funpod.html Feb. 8, 2012, pp. 1-3.

(Continued)

*Primary Examiner* — James Sanders
*Assistant Examiner* — Leith S Shafi
(74) *Attorney, Agent, or Firm* — Strategic Patents, P.C.

(57) ABSTRACT

A three-dimensional printer uses leveling screws with tactile feedback to assist a user in properly orienting a build platform within a working volume.

33 Claims, 13 Drawing Sheets

(56) References Cited

U.S. PATENT DOCUMENTS

| | | | |
|---|---|---|---|
| 2002/0000027 A1* | 1/2002 | Andersen et al. | 24/535 |
| 2009/0091063 A1* | 4/2009 | Petersson et al. | 264/320 |
| 2010/0100222 A1* | 4/2010 | Skubic et al. | 700/110 |
| 2012/0046779 A1* | 2/2012 | Pax et al. | 700/112 |

OTHER PUBLICATIONS

"Ultra-Bot 3D Printer, William Steele", http://www.kickstarter.com/projects/wjsteele/ultra-bot-3d-printer/posts/362119 Dec. 4, 2012, pp. 1-17.

* cited by examiner

BUILD PLATFORM LEVELING WITH TACTILE FEEDBACK

RELATED APPLICATIONS

This application claims the benefit of U.S. App. No. 61/657,241 filed on Jun. 8, 2012, the entire content of which is hereby incorporated by reference.

BACKGROUND

There remains a need for improved techniques for leveling a build platform of a three-dimensional printer to remove or reduce skew and provide more accurate processing height across the build platform.

SUMMARY

A three-dimensional printer uses leveling screws with tactile feedback to assist a user in properly orienting a build platform within a working volume.

In one aspect, the three-dimensional printer includes a build platform having a top surface facing a working volume of a three-dimensional printer and a bottom surface opposing the top surface; a base plate in a fixed relationship to a component of the three-dimensional printer, the base plate having a hole therethrough and a number of contact points positioned radially about the hole of the base plate; a threaded rod extending from the bottom surface of the build platform through the hole in the base plate; a spring between the build platform and the base plate; and a thumbscrew coupled to the threaded rod below the base plate, the thumbscrew having a top surface facing the base plate and a second number of contact points arranged radially about a center of the thumbscrew and positioned to mechanically engage the contact points of the base plate.

The spring may be shaped and sized to bias the build platform away from the base plate. The spring may be shaped and sized to bias the build platform toward the base plate. The spring may include a coil spring captively retained by the threaded rod between the build platform and the base plate.

In a further aspect, the base plate may be in a fixed relationship to a z-stage positioning mechanism of the three-dimensional printer. The base plate may also or instead be in a fixed relationship to an x-y-stage positioning mechanism of the three-dimensional printer.

The threaded rod may be threadably coupled to the build platform and coupled in a rotationally fixed manner to the thumbscrew. The threaded rod may instead be threadably coupled to the thumbscrew and coupled in a rotationally fixed manner to the build platform.

The contact points of the base plate may include a number of radially extending ridges on the bottom surface of the base plate. In some aspects, the base plate includes eight contact points extending evenly and radially about the hole. In some aspects, the contact points of the base plate include recessed grooves.

The second set of contact points of the thumbscrew may include a number of radially extending ridges on the top of the thumbscrew. The second set of contact points of the thumbscrew may for example include eight ridges evenly and radially spaced about the center of the thumbscrew. The contact points of the thumbscrew may include recessed grooves.

The build platform may include three holes in the base plate, three threaded rods, and three thumbscrews, each one of the three thumbscrews operable to adjust the height on the build platform within the working volume of the three-dimensional printer. The three-dimensional printer may include a processor programmed to execute a three-point leveling program to guide a user through a build platform leveling process using the three thumbscrews.

The build platform may also or instead include four holes in the base plate, four threaded rods, and four thumbscrews, each one of the four thumbscrews operable to adjust a height of a location on the build platform within a working volume of the three-dimensional printer. The processor may be programmed to execute a four-point leveling program to guide a user through a build platform leveling process using the four thumbscrews.

The contact points of the base plate may be on the bottom surface of the base plate. The contact points of the base plate may be on the sides of the base plate holes. The threaded rod may have a one millimeter thread pitch. The build platform may be a heated build platform. The base plate may be removably and replaceably attached to the three-dimensional printer. The build platform may include a working surface to receive an object. The working surface may be removably and replaceably attached to the build platform and the working surface may be adapted to receive an object fabricated by the three-dimensional printer in the working volume. The working surface may include a moving conveyer.

The number of contact points of the base plate and the second number of contact points of the thumbscrew may cooperatively provide eight discrete rotational positions for the thumbscrew. The number of contact points of the base plate and the second number of contact points of the thumbscrew may cooperatively provide sixteen discrete rotational positions for the thumbscrew.

In another aspect, a system may include a three-dimensional printer having a working volume with a z-axis, a build platform in the working volume, and a number of leveling mechanisms. Each leveling mechanism may be coupled to the build platform and providing manual control of a position on the z-axis of a location on the build platform within the working volume in a number of steps, the steps being repeatable steps among discrete z-axis locations. The leveling mechanisms may provide tactile feedback to an operator of the leveling mechanism for each transition between adjacent ones of the steps.

Each leveling mechanism may convert a manual rotation of a thumbscrew into a movement along the z-axis of a corresponding location of the build platform. The thumbscrews may rotate about an axis parallel to the z-axis. The thumbscrews may rotate about an axis passing through the corresponding location of the build platform.

BRIEF DESCRIPTION OF THE FIGURES

The invention and the following detailed description of certain embodiments thereof may be understood by reference to the following figures.

DETAILED DESCRIPTION

All documents mentioned herein are hereby incorporated in their entirety by reference. References to items in the singular should be understood to include items in the plural, and vice versa, unless explicitly stated otherwise or clear from the context. Grammatical conjunctions are intended to express any and all disjunctive and conjunctive combinations of conjoined clauses, sentences, words, and the like, unless otherwise stated or clear from the context. Thus the term "or" should generally be understood to mean "and/or" and so forth.

The following description emphasizes three-dimensional printers using fused deposition modeling or similar techniques where a bead of material is extruded in a layered series of two dimensional patterns as "roads," "paths" or the like to form a three-dimensional object from a digital model. It will be understood, however, that numerous additive fabrication techniques are known in the art including without limitation multijet printing, stereolithography, Digital Light Processor ("DLP") three-dimensional printing, selective laser sintering, and so forth. Such techniques may benefit from the systems and methods described below, and all such printing technologies are intended to fall within the scope of this disclosure, and within the scope of terms such as "printer", "three-dimensional printer", "fabrication system", and so forth, unless a more specific meaning is explicitly provided or otherwise clear from the context.

Figure 1:
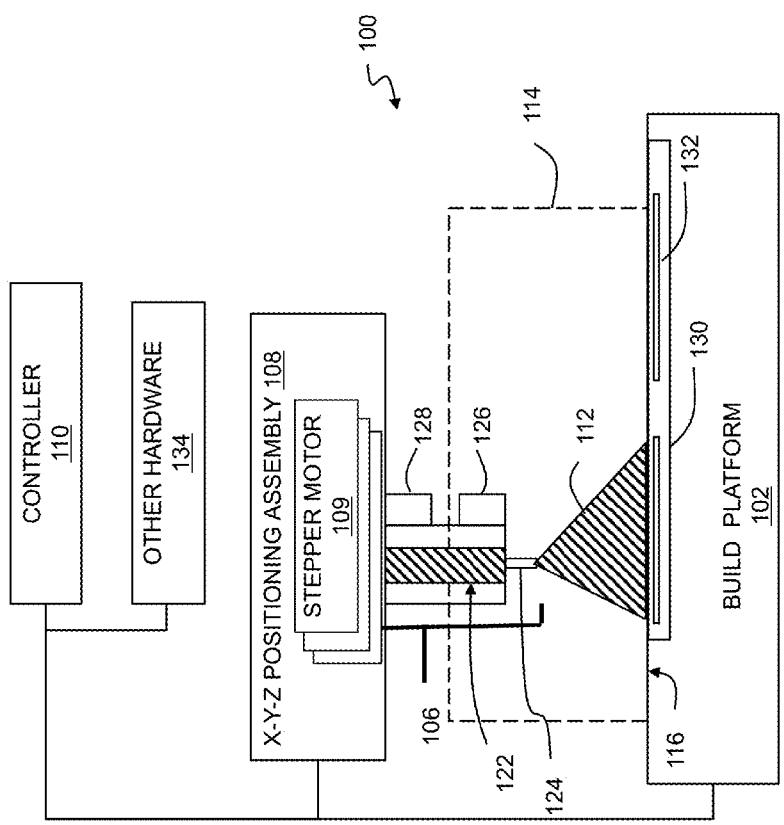
FIG. 1 is a block diagram of a three-dimensional printer.

FIG. 1 is a block diagram of a three-dimensional printer. In general, the printer 100 may include a build platform 102, an extruder 106, an x-y-z positioning assembly 108, and a controller 110 that cooperate to fabricate an object 112 within a working volume 114 of the printer 100.

The build platform 102 may include a surface 116 that is rigid and substantially planar. The surface 116 may provide a fixed, dimensionally and positionally stable platform on which to build the object 112. The build platform 102 may include a thermal element 130 that controls the temperature of the build platform 102 through one or more active devices 132, such as resistive elements that convert electrical current into heat, Peltier effect devices that can create a heating or cooling affect, or any other thermoelectric heating and/or cooling devices. The thermal element 130 may be coupled in a communicating relationship with the controller 110 in order for the controller 110 to controllably impart heat to or remove heat from the surface 116 of the build platform 102.

The extruder 106 may include a chamber 122 in an interior thereof to receive a build material. The build material may, for example, include acrylonitrile butadiene styrene ("ABS"), high-density polyethylene ("HDPL"), polylactic acid ("PLA"), or any other suitable plastic, thermoplastic, or other material that can usefully be extruded to form a three-dimensional object. The extruder 106 may include an extrusion tip 124 or other opening that includes an exit port with a circular, oval, slotted or other cross-sectional profile that extrudes build material in a desired cross-sectional shape.

The extruder 106 may include a heater 126 (also referred to as a heating element) to melt thermoplastic or other meltable build materials within the chamber 122 for extrusion through an extrusion tip 124 in liquid form. While illustrated in block form, it will be understood that the heater 126 may include, e.g., coils of resistive wire wrapped about the extruder 106, one or more heating blocks with resistive elements to heat the extruder 106 with applied current, an inductive heater, or any other arrangement of heating elements suitable for creating heat within the chamber 122 sufficient to melt the build material for extrusion. The extruder 106 may also or instead include a motor 128 or the like to push the build material into the chamber 122 and/or through the extrusion tip 124.

In general operation (and by way of example rather than limitation), a build material such as ABS plastic in filament form may be fed into the chamber 122 from a spool or the like by the motor 128, melted by the heater 126, and extruded from the extrusion tip 124. By controlling a rate of the motor 128, the temperature of the heater 126, and/or other process parameters, the build material may be extruded at a controlled volumetric rate. It will be understood that a variety of techniques may also or instead be employed to deliver build material at a controlled volumetric rate, which may depend upon the type of build material, the volumetric rate desired, and any other factors. All such techniques that might be suitably adapted to delivery of build material for fabrication of a three-dimensional object are intended to fall within the scope of this disclosure.

The x-y-z positioning assembly 108 may generally be adapted to three-dimensionally position the extruder 106 and the extrusion tip 124 within the working volume 114. Thus by controlling the volumetric rate of delivery for the build material and the x, y, z position of the extrusion tip 124, the object 112 may be fabricated in three dimensions by depositing successive layers of material in two-dimensional patterns derived, for example, from cross-sections of a computer model or other computerized representation of the object 112. A variety of arrangements and techniques are known in the art to achieve controlled linear movement along one or more axes. The x-y-z positioning assembly 108 may, for example, include a number of stepper motors 109 to independently control a position of the extruder 106 within the working volume along each of an x-axis, a y-axis, and a z-axis. More generally, the x-y-z positioning assembly 108 may include without limitation various combinations of stepper motors, encoded DC motors, gears, belts, pulleys, worm gears, threads, and so forth. For example, in one aspect the build platform 102 may be coupled to one or more threaded rods by captive nuts or the like so that the threaded rods can be rotated to provide z-axis positioning of the build platform 102 relative to the extruder 124. This arrangement may advantageously simplify design and improve accuracy by permitting an x-y positioning mechanism for the extruder 124 to be fixed relative to a build volume. Similarly, the extruder 124 may be coupled to a z-axis positioning stage while the build platform 102 is coupled to an x-y positioning stage. More generally, any arrangement suitable for controllably positioning the extruder 106 within the working volume 114 and/or relative to the build platform 102 may be adapted to use with the printer 100 described herein.

In general, this may include moving the extruder 106, or moving the build platform 102, or some combination of these. Thus it will be appreciated that any reference to moving an extruder relative to a build platform, working volume, or object, is intended to include movement of the extruder or movement of the build platform, or both, unless a more specific meaning is explicitly provided or otherwise clear from the context. Still more generally, while an x, y, z coordinate system serves as a convenient basis for positioning within three dimensions, any other coordinate system or combination of coordinate systems may also or instead be employed, such as a positional controller and assembly that operates according to cylindrical or spherical coordinates.

The controller 110 may be electrically or otherwise coupled in a communicating relationship with the build platform 102, the x-y-z positioning assembly 108, and the other various components of the printer 100. In general, the controller 110 is operable to control the components of the printer 100, such as the build platform 102, the x-y-z positioning assembly 108, and any other components of the printer 100 described herein to fabricate the object 112 from the build material. The controller 110 may include any combination of software and/or processing circuitry suitable for controlling the various components of the printer 100 described herein including without limitation microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and so forth. In one aspect, this may include circuitry directly and physically associated with the printer 100 such as an on-board processor or microcontroller. In another aspect, this may be a processor associated with a personal computer or other computing device coupled to the printer 100, e.g., through a wired or wireless connection. Similarly, various functions described herein may be allocated between an on-board processor for the printer 100 and a separate computer. All such computing devices and environments are intended to fall within the meaning of the term "controller" or "processor" as used herein, unless a different meaning is explicitly provided or otherwise clear from the context.

A variety of additional sensors and other components may be usefully incorporated into the printer 100 described above. These other components are generically depicted as other hardware 134 in FIG. 1, for which the positioning and mechanical/electrical interconnections with other elements of the printer 100 will be readily understood and appreciated by one of ordinary skill in the art. The other hardware 134 may include a temperature sensor positioned to sense a temperature of the surface of the build platform 102, the extruder 126, or any other system components as well as a surrounding, ambient temperature. This may, for example, include a thermistor or the like embedded within or attached below the surface of the build platform 102. This may also or instead include an infrared detector or the like directed at the surface 116 of the build platform 102.

In another aspect, the other hardware 134 may include a sensor to detect a presence of the object 112 at a predetermined location. This may include an optical detector arranged in a beam-breaking configuration to sense the presence of the object 112 at a predetermined location. This may also or instead include an imaging device and image processing circuitry to capture an image of the working volume and to analyze the image to evaluate a position of the object 112. This sensor may be used for example to ensure that the object 112 is removed from the build platform 102 prior to beginning a new build on the working surface 116. Thus the sensor may be used to determine whether an object is present that should not be, or to detect when an object is absent. The feedback from this sensor may be used by the controller 110 to issue processing interrupts or otherwise control operation of the printer 100.

The other hardware 134 may also or instead include a heating element (instead of or in addition to the thermal element 130) to heat the working volume such as a radiant heater or forced hot air heater to maintain the object 112 and the surrounding air at a fixed, elevated temperature throughout a build, or the other hardware 134 may similarly include a cooling element to cool the working volume.

Figure 2:
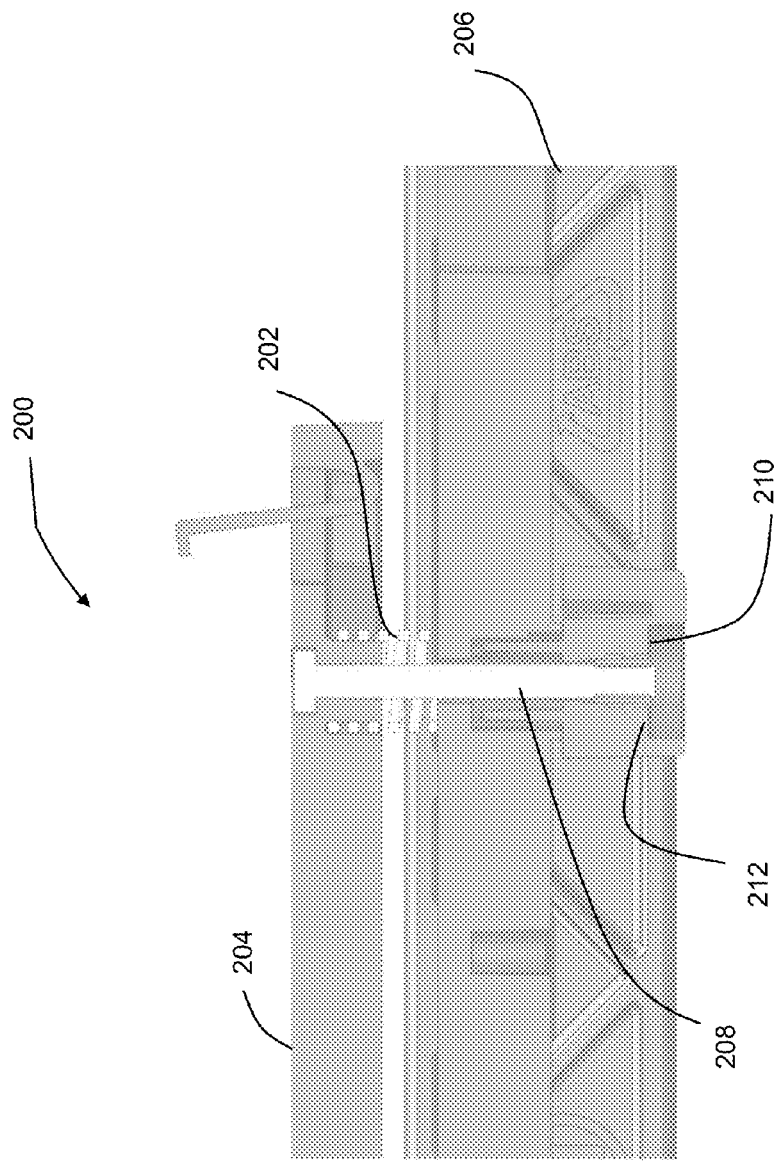
FIG. 2 is a cut away view of a mechanism for adjusting the height of a build platform.

FIG. 2 shows a mechanism 200 for adjusting the height of a build platform with tactile feedback.

In general, a spring 202 may held between a build platform 204 and a support structure 206 to provide a biasing upward force to the build platform relative to the support structure. It will be understood that a variety of springs and spring mechanisms may be used as the spring 202. For example, the spring 202 may be a coil spring held captive as illustrated between the build platform 204 and the underlying support structure 206, with the spring 202 retained in an axial alignment by a thumbscrew 208 having a threaded end passing through a center of the spring 202. The spring 202 may also or instead include a leaf spring or any other type of spring or combination of springs. Similarly, while the general mechanism described with reference to the figure employs a spring that biases the build platform 204 away from the support structure 206, the spring 202 may instead bias the build platform 204 toward the support structure 206, with the thumbscrew 208 providing a contrary force to adjustably position the build platform 204 against the spring 202 and further away from the support structure 206.

The thumbscrew 208 may thread into the build platform 204 (e.g., into threads formed in the build platform 204, or into a threaded nut or the like within the build platform 204) and, by rotation in one direction, mechanically move the build platform 204 toward the support structure 206 against the biasing upward force of the spring 202. A head 210 of the thumbscrew 208 may include radial grooves, ridges or the like on a top surface 212 that engage corresponding features on a bottom of the support structure 206 in order to provide tactile feedback in the form of clicks or the like as the thumbscrew 208 is rotated among discrete rotational positions. In general, a variety of engagement features may also or instead be employed to provide tactile feedback. These engagement features may usefully perform a dual function of providing a click or the like as the thumbscrew 208 is moved among discrete rotational positions and securing the thumbscrew 208 against unintended movement from such discrete rotational positions. These engagement features may usefully secure the thumbscrew 208 against rotation with a wide range of tenacity according to the desired resistance and tactile feedback. Suitable ranges of applied rotational force, and corresponding dimensions of such engagement features, will be readily appreciated by one of ordinary skill in the art.

In one aspect, the thumbscrew 208 may include eight radial ridges and the support structure 206 may include corresponding grooves providing eight discrete rotational positions for the thumbscrew. Conversely, the thumbscrew 208 may include grooves and the support structure 206 may include ridges, or both surfaces may include complementary ridges. Similarly, while one such engaging surface may provide a number of such features corresponding to the number of desired discrete rotational positions, the complementary features of the opposing surface may use one or more complementary features. For example, where the thumbscrew 208 includes eight radial ridges, the support structure 206 may include a single radial ridge positioned to sequentially engage each of the eight radial ridges of the thumbscrew 208, or the support structure 206 may include two such ridges, four such ridges, or eight such ridges, or any other suitable number. More generally, any mechanical interface may be used that provides a number of discrete rotational positions for the thumbscrew 208 and tactile feedback to a user as the thumbscrew 208 moves from position to position. Similarly, any number of positions may be provided, such as between four and sixteen discrete positions, according to the desired level of fineness to height adjustments for the build platform 204. The translation of these rotational positions into horizontal displacement of the build platform generally depends on the pitch of the threads on the thumbscrew 208. For an embodiment with a one millimeter thread pitch and eight radial grooves, the thumbscrew 208 accommodates adjustments in one-sixteenth millimeter vertical increments. Other arrangements may be provided to simplify user adjustments. For example, the engagement features may include ten equally spaced radial ridges (i.e., at thirty-six degree intervals) so that a 1 mm thread pitch can be adjusted in 0.1 mm increments.

It will be appreciated that the radial ridges (or grooves or other features) may be horizontal features or vertical features. That is, the thumbscrew 208 may have horizontal radial ridges extending radially along the top surface 212, or the thumbscrew 208 may have vertical radial ridges extending radially from a side surface or sidewall of the thumbscrew 208, with corresponding features incorporated into the support structure 206.

While one adjustment point is illustrated, a build platform would typically include two or more such adjustment points, such as four adjustment points at or near four corners of a square or rectangular build platform, or three adjustment points in a triangular arrangement. In a four point system, a height of the build platform may be adjusted, and the z-axis skew of the build platform may also be adjusted relative to a plane of motion for a tool that deposits material on the build platform. Further, while the term "thumbscrew" is used, and a screw that is easily operable with a thumb and finger provides a convenient adjustment mechanism, the "thumbscrew" may also or instead include any tool head suitable for grasping or for adjustment with a tool, or some combination of these.

Figure 3:
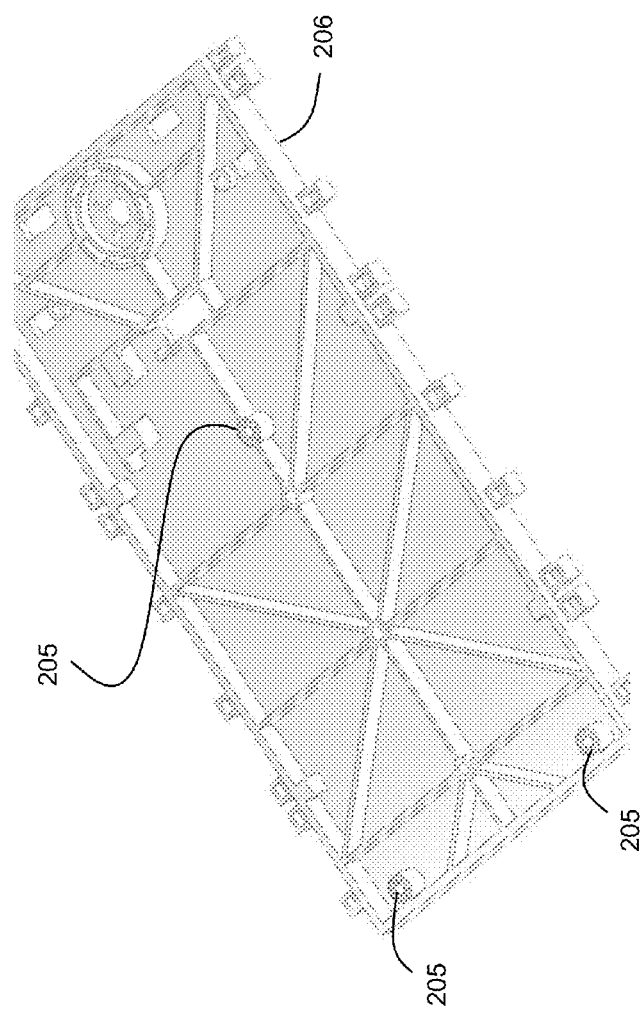
FIG. 3 is a perspective view of a base plate.

FIG. 3 is a perspective view of a base plate 206 (also referred to herein as a support structure 206). The base plate 206 may include several holes 205 to receive thumbscrews. The three holes 205 illustrated in the figure provide a three-point leveling system and provide a through hole for each of three thumbscrews that can be used to adjust the height of the build platform at three predetermined locations. While three holes 205 are shown, some other number such as two holes 205 or four holes 205 may be used. In the embodiment described above, the holes 205 of the base plate 206 do not engage threads of the thumbscrews, instead providing sufficient radial clearance for thumbscrews to rotate freely within the holes 205. It will be appreciated however that other arrangements are possible. For example, a thumbscrew may be affixed to a build platform in a manner that is rotationally free (e.g., by a bearing or the like) while remaining fixed against vertical displacement. The base plate 206 may then be threaded to provide vertical adjustment relative to the build platform when the thumbscrew rotates within the threaded through hole. In another embodiment, the thumbscrew may be rotationally fixed to the build platform, and the thumbscrew may rotate about the threads to provide vertical movement. In either case, a spring or similar mechanism may be positioned between the build platform and the base plate 206 to provide a suitable biasing force.

In one embodiment, the base plate 206 may be coupled to a build platform with a universal or ball joint, and two leveling mechanisms may provided. While this technique permits two-point leveling, it generally sacrifices independent control of mean height. As such, the ball joint or other coupling may include an independent height adjustment mechanism to accommodate fully independent z-axis positioning of the build platform relative to the base plate 206.

Figure 4:
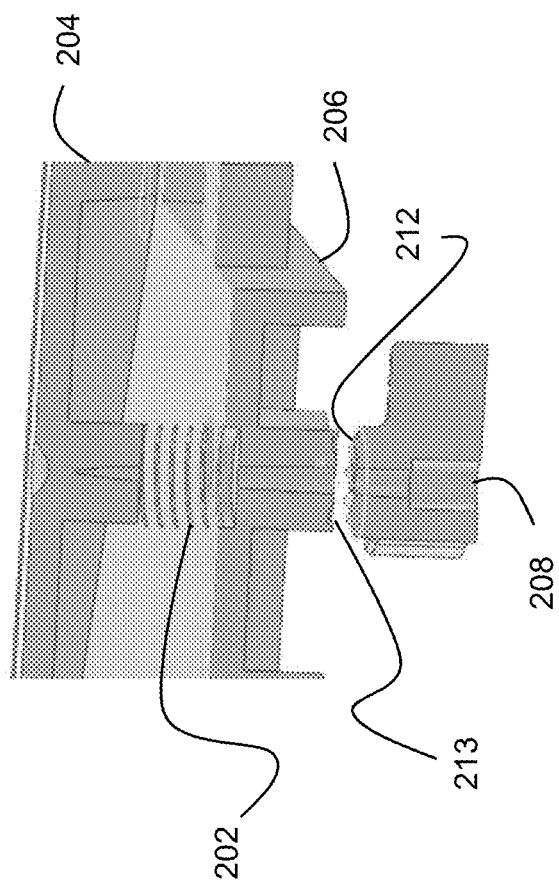
FIG. 4 is a side view of an adjustable-height build platform.

FIG. 4 is a side view of an adjustable-height build platform as described above. A height of the build platform 204 may be adjusted by turning the thumbscrew 208 (threaded portion not shown). The ridges on the top surface 212 may engage with corresponding ridges on the bottom 213 of the support structure 206. The engagement of the ridges on the top surface 212 and the support structure 206 may provide varying degrees of tactile feedback. Additionally, a spring 202 may provide biasing between the ridges of the top surface 212 and corresponding features of the support structure 206.

Figure 5:
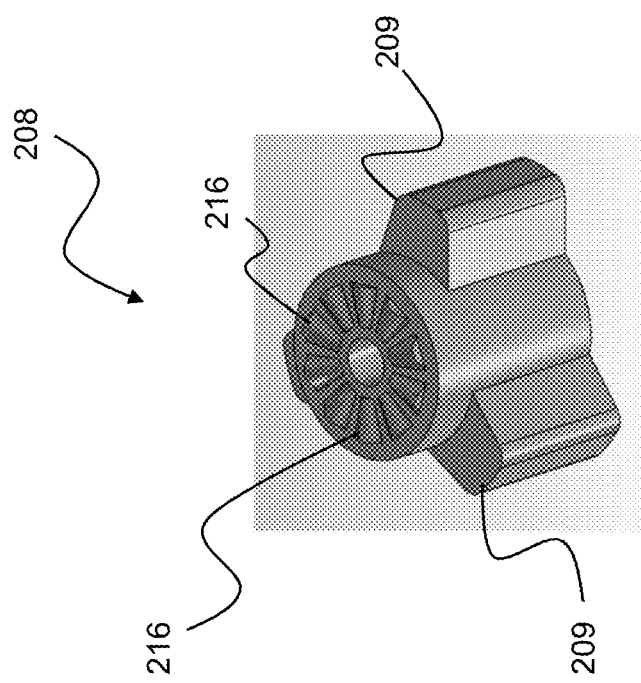
FIG. 5 shows a thumbscrew.
Figure 6:
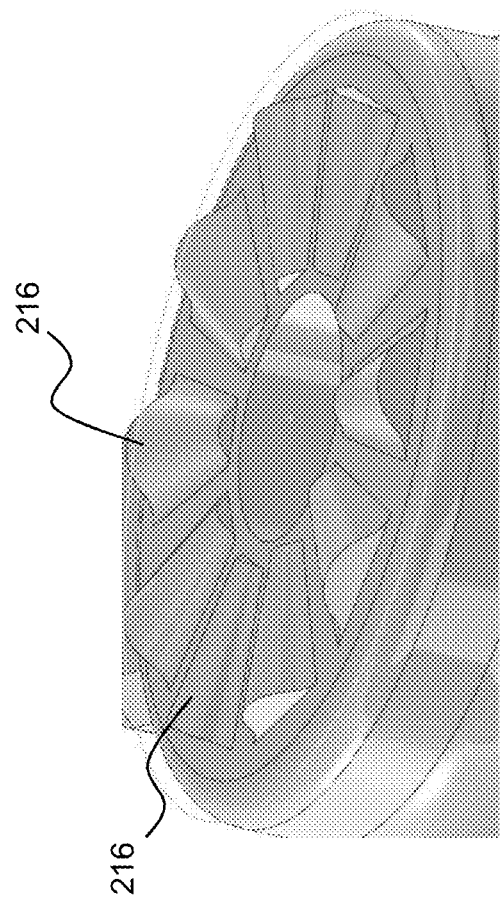
FIG. 6 shows a thumbscrew.

FIGS. 5 and 6 show a thumbscrew 208 with ridges 216 extending radially from the center of the thumbscrew 208 and horizontally in the plane of a build platform or base plate. The thumbscrew may include wings 209 or the like to facilitate grasping and turning of the thumbscrew 208. In this aspect, ten radial ridges 216 are shown. As discussed above, the number of ridges 216 or similar features may vary. Also as noted above, the ridges 216 may be replaced by or complemented with grooves or other engagement features. It should be appreciated that while the term "ridge" may imply a convex feature and the term "groove" may imply a concave feature, the interface for tactile feedback may include engagement features with any combination of either or both such features without departing from the scope of this disclosure. Whether ridges or grooves are used, there will be corresponding engagement features on the support structure to provide tactile feedback.

Figure 7:
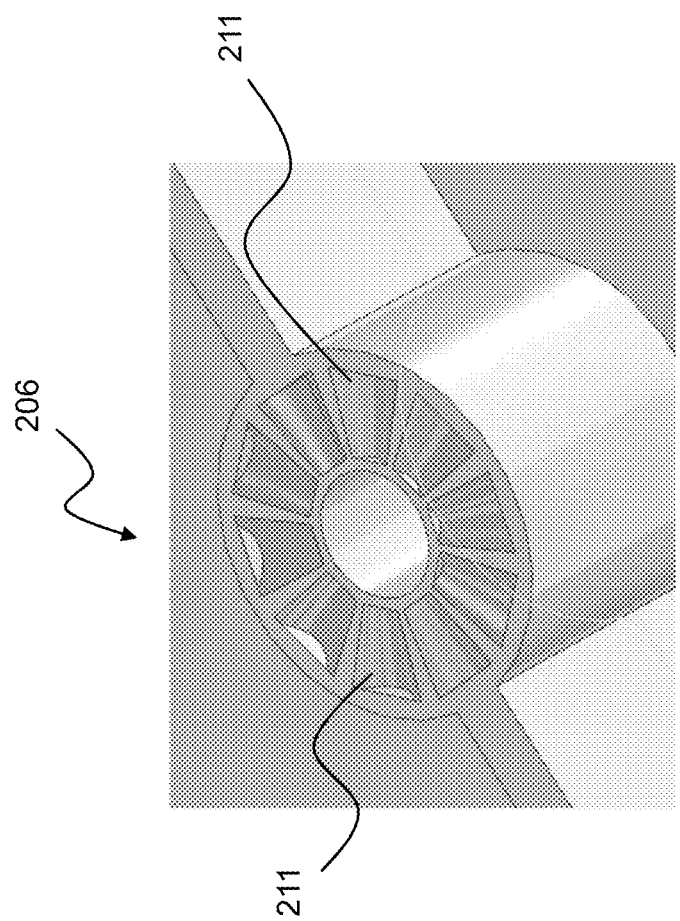
FIG. 7 shows a thumbscrew.

FIG. 7 shows an area of a base plate 206. The base plate 206 may include one or more grooves 211 arranged radially about an axis of a hole through the base plate 206. The grooves 211 may be generally concave, i.e., recessed inward to receive and engage radial ridges or similar features of a thumbscrew.

Figure 8:
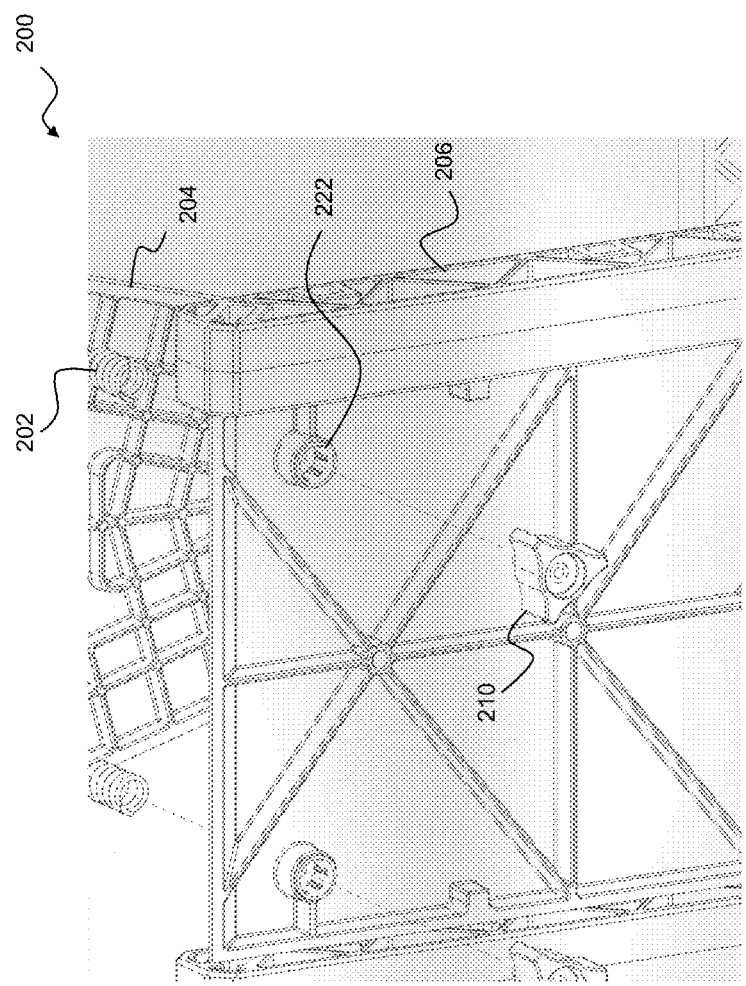
FIG. 8 is a perspective view of a build platform leveling mechanism.

FIG. 8 is a perspective view of a build platform leveling mechanism exploded to illustrate the relationship of various components. A position of the build platform 204 relative to the support structure 206 may be controlled by rotating the thumbscrew 208. In one aspect, the tactile feedback is provided by ridges 222 that are vertically oriented relative to the build platform 204, more specifically extending radially inward toward an axis of the thumbscrew 208 to engage corresponding vertically oriented, radially extending ridges (or grooves) on the sides of the thumbscrew 208. In this arrangement, a biasing spring may not be needed to engage the tactile feedback mechanism, but may still be usefully employed to provide a general vertical bias to the build platform 204 relative to the support structure 206.

Figure 9:
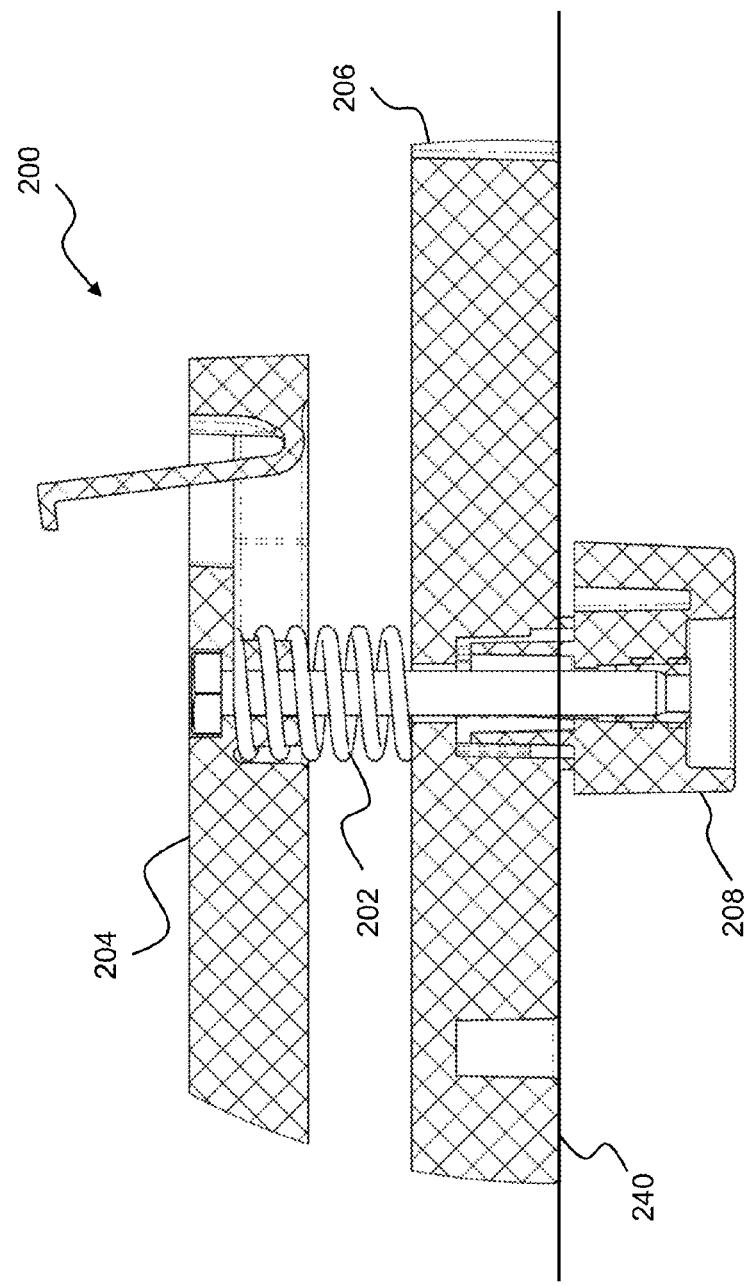
FIG. 9 is a cross section of a build platform leveling mechanism.

FIG. 9 is a cross section of a build platform leveling mechanism. In this embodiment, the ridges of the base plate 206 are parallel to the side of the hole, i.e., vertically oriented relative to a plane 240 of the build platform 204 and the base plate 206, and the ridges provide a mechanical interference engagement with radially extending, vertical ridges or flanges of the thumbscrew 208 to provide tactile feedback while rotating the thumbscrew 208 to adjust a height of the build platform 204 relative to the base plate 206.

Figure 10:
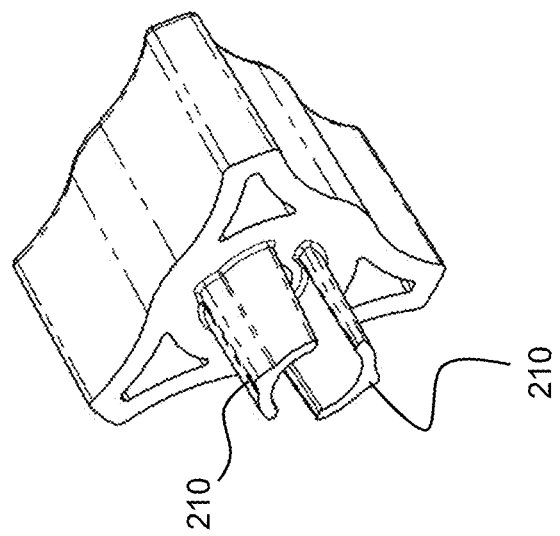
FIG. 10 shows a thumbscrew.

FIG. 10 is a view of a thumbscrew with vertical ridges. The thumbscrew 208 may be used, for example, with the base plate illustrated in FIGS. 8 and 9 to provide tactile feedback for build platform leveling. A ridge 226 of the thumbscrew 208 may provide tactile feedback for rotation of the thumbscrew 208 by engaging corresponding vertical ridges or the like within a base plate. The ridge 226 (of which there may be any number) of the thumbscrew 208 may be flexible to accommodate compression toward a center or axis of the thumbscrew as the ridge contacts mating surfaces during rotation.

Figure 11:
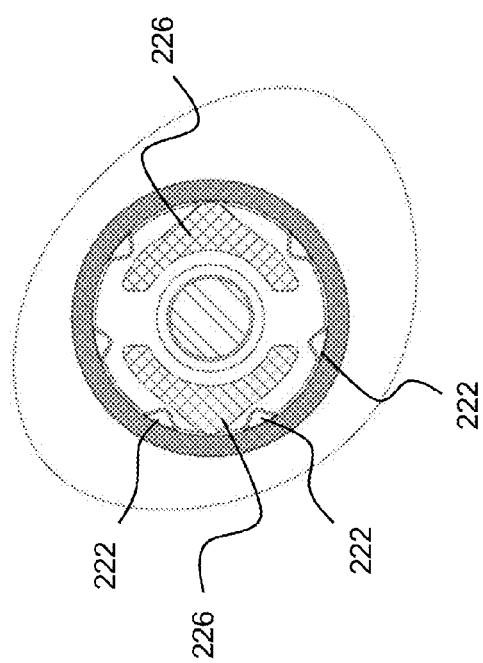
FIG. 11 is a cross section of a thumbscrew seated in a base plate.

FIG. 11 is a cross section of a thumbscrew seated in the base plate. The base plate may include one or more ridges 222 vertically oriented within an opening in the base plate in positions corresponding to the ridges 226 of a thumbscrew positioned therein. The ridges 222 may be of any length and number suitable to provide a desired mechanical interference with the ridge 226 of the thumbscrew.

Figure 12:
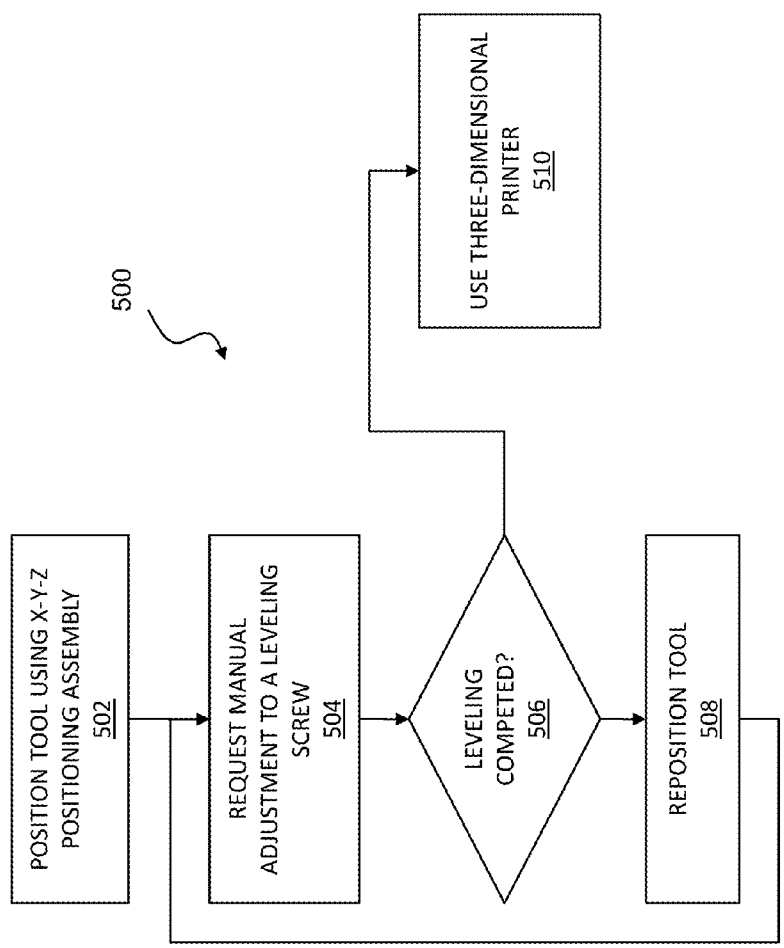
FIG. 12 shows a process for build platform leveling.

FIG. 12 shows a process for build platform leveling. In general, the process 500 may support an interactive user process for leveling a build platform. This may for example include three-point leveling (e.g., where there are three adjustment screws), four-point leveling (e.g., where there are four adjustment screws), or leveling at any other number and arrangement of predetermined locations on the build platform relative to a printer tool or other positioning instrument.

As shown in step 502, the process 500 may begin with positioning a tool with an x-y-z positioning assembly such as any of the positioning assemblies described above. This step may be initiated in response to a user command, or automatically initiated when a printer is powered on for the first time (or for the first time by a customer after shipping from a manufacturing facility or distribution site). In one aspect, a user may issue a command through a control panel of a three-dimensional printer or from a computer connected to the three-dimensional printer. Positioning may include moving the tool, which may be an extruder or other tool or the like of a three-dimensional printer, to a predetermined location such as a corner of a build platform, a center of the build platform, a location on a perimeter of the build platform, a location of a height-adjustment leveling screw in the build platform, or any other suitable location within a working volume. This may also include moving the tool and/or the positioning assembly over a range of positions before moving to the predetermined location, for example to locate a number of end stops or the like for the x-y-z positioning assembly.

As shown in step 504, the process 500 may include requesting a manual adjustment to a leveling screw. This may include a conditional instruction, which may be displayed on a control panel of the printer or on a connected computer or other computing device, or issued as an audible alert or the like from any of the foregoing. For example, the conditional instruction may be referenced to a user-perceived event in the form "turn thumbscrew to the right until the tool touches the build platform, and then turn to the left one click." Or where a shim or other reference is used, the conditional instruction may be referenced to the shim. For example, the conditional instruction may be in the form, "slide a piece of paper between the build platform and the extruder, and then turn the thumbscrew to the right until the paper can just fit between the build platform and the extruder." The instruction may also or instead include absolute instructions. For example, the instruction may take the form, "turn the thumbscrew one click to the right." This form may be particularly useful where the three-dimensional printer includes distance or proximity sensors that can detect a distance between the tool and the build platform, in which case a measured gap can be readily converted into a number of discrete clicks of the thumb screw, and instructions can be provided to the user to provide an appropriate manual leveling operation with the thumbscrew.

As shown in step 506, it may be determined whether a leveling process is completed. This may include detecting the completion of a leveling step, such as any of the steps described above, e.g., in response to user input confirming completion of the step. In another aspect, where the thumbscrew produces audible clicks, this may be determined through audio detection of discrete thumbscrew movements or the like, and may be followed with audio feedback such as a spoken command to stop. Once the particular leveling step is completed, the process 500 may include determining whether additional leveling steps are required, e.g., based upon any suitable leveling protocol. If additional steps are required, the process 500 may proceed to step 508 where the printer tool may be repositioned for additional leveling steps. If additional steps are not required, the process 500 may proceed to step 510 where the printer may be used for fabrication in any suitable fashion.

As shown in step 508, where additional leveling steps are required, the three-dimensional printer may reposition a tool such as to a next sequential predetermined location on the build platform. The process 500 may then return to step 504 where additional manual adjustments may be requested.

By repeating the above process 500 in this manner for a number of predetermined locations on a build platform, the height of a build platform may be adjusted according to any predetermined protocol, and skew of the build platform may be reduced or eliminated relative to an x-y plane or the like of a three dimensional printer or a positioning assembly for same.

It will be readily appreciated that the various steps described above may be reordered, omitted, modified, or supplemented with additional steps according to a desired leveling protocol. For example, after receiving a sequence of manual adjustments at predetermined locations, the process 500 may return to the leveled positions, or to any other representative, predetermined locations on the build platform to request confirmation of accurate leveling. All such variations are intended to fall within the scope of this disclosure.

Figure 13:
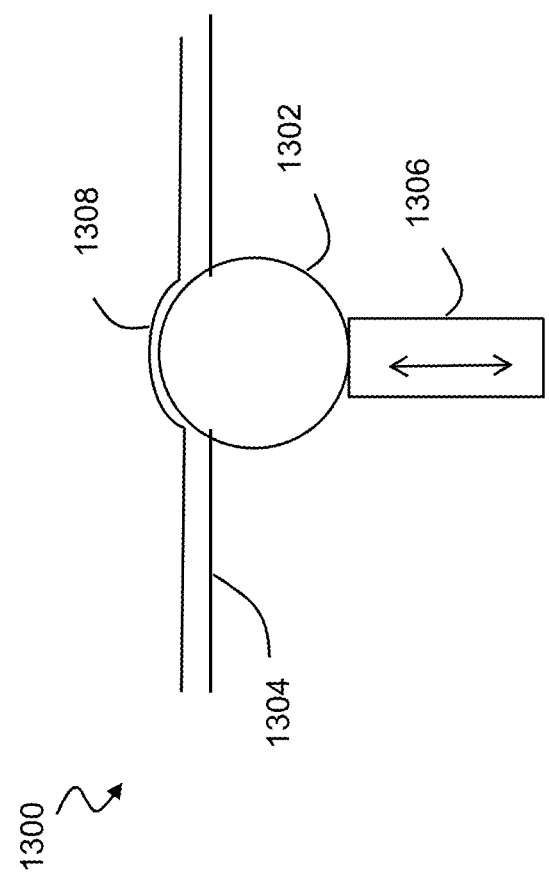
FIG. 13 shows a ball and detent tactile feedback mechanism.

FIG. 13 shows a ball detent mechanism for providing tactile feedback. While a variety of complementary engagement features for a base plate and thumbscrew are described above, it will be appreciated that numerous other techniques for providing tactile feedback for mechanical (and more specifically, rotational) movements are known in the art and may be suitably employed in a build platform leveling system as contemplated herein. By way of non-limiting example, a ball and detent mechanism may be usefully employed, as illustrated in FIG. 13.

In general, a ball detent mechanism is a mechanism for temporarily securing two items in relation to one another. The mechanism 1300 includes a ball 1302 or similarly-shaped object supported against a surface 1304 with a spring 1306 that biases the ball 1302 to protrude above the surface 1304. Another object includes a detent 1308 shaped to receive a portion of the ball 1302. When a lateral force is applied sufficient to overcome the force of the spring 1306, the ball 1302 retreats from the surface 1304 and permits the detent 1308 to move away from the ball. A number ball detent fixtures may be provided, e.g., about the radius of a knob, thumbscrew or the like to provide a number of discrete rotational positions for a leveling mechanism as contemplate above. Still more generally, any mechanism that provides for tactile and/or audible feedback as a leveling adjustment moves from one discrete position to another may be adapted for use as the leveling mechanism for build platform leveling as contemplated herein.

Many of the above systems, devices, methods, processes, and the like may be realized in hardware, software, or any combination of these suitable for the control, data acquisition, and data processing described herein. This includes realization in one or more microprocessors, microcontrollers, embedded microcontrollers, programmable digital signal processors or other programmable devices or processing circuitry, along with internal and/or external memory, any of which may serve as the controller described above or supplement processing of the controller with additional circuitry. This may also, or instead, include one or more application specific integrated circuits, programmable gate arrays, programmable array logic components, or any other device(s) that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software. At the same time, processing may be distributed across devices such as the various systems described above, or all of the functionality may be integrated into a dedicated, standalone device. All such permutations and combinations are intended to fall within the scope of the present disclosure.

In other embodiments, disclosed herein are computer program products comprising computer-executable code or computer-usable code that, when executing on one or more computing devices (such as the devices/systems described above), performs any and/or all of the steps described above. The code may be stored in a computer memory or other tangible, non-transitory computer readable medium, which may be a memory from which the program executes (such as random access memory associated with a processor), or a storage device such as a disk drive, flash memory or any other optical, electromagnetic, magnetic, infrared or other device or combination of devices. In another aspect, any of the processes described above may be embodied in any suitable transmission or propagation medium carrying the computer-executable code described above and/or any inputs or outputs from same.

It will be appreciated that the methods and systems described above are set forth by way of example and not of limitation. Numerous variations, additions, omissions, and other modifications will be apparent to one of ordinary skill in the art. Thus, the order or presentation of method steps in the description and drawings above is not intended to require this order of performing the recited steps unless a particular order is expressly required or otherwise clear from the context.

While particular embodiments of the present invention have been shown and described, it will be apparent to those skilled in the art that various changes and modifications in form and details may be made therein without departing from the spirit and scope of this disclosure and are intended to form a part of the invention as defined by the following claims, which are to be interpreted in the broadest sense allowable by law.

What is claimed is:

1. A device comprising:
   a build platform having a top surface facing a working volume of a three-dimensional printer and a bottom surface opposing the top surface;
   a base plate in a fixed relationship to a component of the three-dimensional printer, the base plate having a hole therethrough and a first number of contact points positioned radially about the hole of the base plate, the first number of contact points including at least one of radial ridges and radial grooves;
   a threaded rod extending from the bottom surface of the build platform through the hole in the base plate;
   a spring between the build platform and the base plate;
   a thumbscrew coupled to the threaded rod below the base plate, the thumbscrew having a top surface facing the base plate and a second number of contact points arranged radially about a center of the thumbscrew, the second number of contact points including at least one of radial ridges and radial grooves corresponding to the first number of contact points and positioned to mechanically engage the first number of contact points of the base plate such that rotation of the thumbscrew by a user between discrete rotational positions relative to the base plate provides tactile feedback to the user in the form of clicks, wherein a click corresponds to a predetermined height adjustment for at least a portion of the build platform; and
   a control panel configured to convert a measured gap between a desired position of at least a portion of the build platform and an actual position of at least the portion of the build platform into a number of clicks for closing the measured gap, the control panel communicating instructions for a user to rotate the thumbscrew the number of clicks during a leveling procedure of the build platform.

2. The device of claim 1 wherein the spring is shaped and sized to bias the build platform away from the base plate.

3. The device of claim 1 wherein the spring is shaped and sized to bias the build platform toward the base plate.

4. The device of claim 1 wherein the spring includes a coil spring captively retained by the threaded rod between the build platform and the base plate.

5. The device of claim 1 wherein the base plate is in a fixed relationship to a z-stage positioning mechanism of the three-dimensional printer.

6. The device of claim 1 wherein the base plate is in a fixed relationship to an x-y-stage positioning mechanism of the three-dimensional printer.

7. The device of claim 1 wherein the threaded rod is threadably coupled to the build platform and coupled in a rotationally fixed manner to the thumbscrew.

8. The device of claim 1 wherein the threaded rod is threadably coupled to the thumbscrew and coupled in a rotationally fixed manner to the build platform.

9. The device of claim 1 wherein the first number of contact points of the base plate include a number of radially extending ridges on the bottom surface of the base plate.

10. The device of claim 1 wherein the first number of contact points of the base plate includes eight ridges evenly radially spaced about the hole.

11. The device of claim 1 wherein the first number of contact points of the base plate includes recessed grooves.

12. The device of claim 1 wherein the second number of contact points of the thumbscrew include a number of radially extending ridges on the top of the thumbscrew extending horizontally to a plane of the base plate.

13. The device of claim 1 wherein the second number of contact points of the thumbscrew include a number of radially extending ridges on a side of the thumbscrew extending vertically to a plane of the base plate.

14. The device of claim 1 wherein the second number of contact points of the thumbscrew includes eight ridges evenly radially spaced about the center of the thumb screw.

15. The device of claim 1 wherein the second number of contact points of the thumbscrew includes recessed grooves.

16. The device of claim 1 further comprising three holes in the base plate, three threaded rods, and three thumbscrews, each one of the three thumbscrews operable to adjust a height of a location on the build platform within a working volume of the three-dimensional printer.

17. The device of claim 16 further comprising a processor programmed to execute a three-point leveling program to guide a user through a build platform leveling process using the three thumbscrews.

18. The device of claim 1 further comprising four holes in the base plate, four threaded rods, and four thumbscrews, each one of the four thumbscrews operable to adjust a height of a location on the build platform within a working volume of the three-dimensional printer.

19. The device of claim 18 further comprising a processor programmed to execute a four-point leveling program to guide a user through a build platform leveling process using the four thumbscrews.

20. The device of claim 1 wherein the threaded rod has a one millimeter thread pitch.

21. The device of claim 1 wherein the build platform is a heated build platform.

22. The device of claim 1 further comprising a working surface to receive an object.

23. The device of claim 1 further comprising a working surface removably and replaceably attached to the build platform, the working surface adapted to receive an object fabricated by the three-dimensional printer in the working volume.

24. The device of claim 23 wherein the working surface includes a moving conveyor.

25. The device of claim 1 wherein the first number of contact points of the base plate and the second number of contact points of the thumbscrew cooperatively provide eight discrete rotational positions for the thumbscrew.

26. The device of claim 1 wherein the first number of contact points of the base plate and the second number of contact points of the thumbscrew cooperatively provide sixteen discrete rotational positions for the thumbscrew.

27. The device of claim 1 wherein the first number of contact points of the base plate are on the bottom surface of the base plate.

28. The device of claim 1 wherein the first number of contact points of the base plate are on the sides of the base plate hole.

29. A system comprising:
a three-dimensional printer having a working volume with a z-axis;
a build platform in the working volume;
a number of leveling mechanisms, each leveling mechanism coupled to the build platform and providing manual control of a position on the z-axis of a location on the build platform within the working volume in a number of steps, the steps being repeatable steps among discrete z-axis locations, wherein the leveling mechanism provides tactile feedback to an operator of the leveling mechanism for each transition between adjacent ones of the steps, the tactile feedback provided by corresponding contact points including radial ridges and radial grooves on the number of leveling mechanisms, the tactile feedback including clicks, wherein a click corresponds to movement of the location of the build platform between the steps; and
a control panel configured to convert a measured gap between a desired position of the location of the build platform and an actual position of the location of the build platform into a number of clicks for closing the measured gap, the control panel communicating instructions for a user to adjust one or more of the leveling mechanisms by the number of clicks during a leveling procedure of the build platform.

30. The system of claim 29 wherein each leveling mechanism converts a manual rotation of a thumbscrew into a movement along the z-axis of a corresponding location of the build platform.

31. The system of claim 30 wherein the thumbscrew rotates about an axis parallel to the z-axis.

32. The system of claim 31 wherein the thumbscrew rotates about an axis passing through the corresponding location on the build platform.

33. The system of claim 29 wherein the leveling mechanism provides audible feedback to the operator of the leveling mechanism for each transition between adjacent ones of the steps.

* * * * *